(12) United States Patent
Zhuang et al.

(10) Patent No.: US 12,223,826 B2
(45) Date of Patent: Feb. 11, 2025

(54) HAPTIC FEEDBACK SYSTEM

(71) Applicant: TDK TAIWAN CORP., Taoyuan (TW)

(72) Inventors: Po-Xiang Zhuang, Taoyuan (TW); Wei-Jhe Shen, Taoyuan (TW); Yi-Ho Chen, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 504 days.

(21) Appl. No.: 17/587,534

(22) Filed: Jan. 28, 2022

(65) Prior Publication Data

US 2023/0041673 A1 Feb. 9, 2023

Related U.S. Application Data

(60) Provisional application No. 63/230,990, filed on Aug. 9, 2021.

(51) Int. Cl.
*G08B 6/00* (2006.01)
*G02B 7/08* (2021.01)
(Continued)

(52) U.S. Cl.
CPC ............... *G08B 6/00* (2013.01); *G02B 7/08* (2013.01); *G03B 5/00* (2013.01); *G03B 9/40* (2013.01); *G03B 13/36* (2013.01); *H02K 11/21* (2016.01); *H02K 41/0354* (2013.01); *H04N 23/51* (2023.01); *H04N 23/54* (2023.01); *H04N 23/55* (2023.01); *H04N 23/57* (2023.01); *H05K 1/181* (2013.01); *H05K 2201/10916* (2013.01)

(58) Field of Classification Search
CPC .......... G02B 27/646; G02B 7/08; G02B 7/09; G03B 13/36; G03B 2205/0023; G03B 2205/0069; G03B 3/10; G03B 30/00; G03B 5/00; G03B 9/40; G08B 6/00; H02K 11/21; H02K 41/0354; H04N 23/51; H04N 23/54; H04N 23/55; H04N 23/57; H05K 1/181; H05K 2201/10916
See application file for complete search history.

(56) References Cited

U.S. PATENT DOCUMENTS

| | | | |
|---|---|---|---|
| 2005/0134562 A1* | 6/2005 | Grant | G06F 3/016 345/161 |
| 2018/0021812 A1* | 1/2018 | Akanuma | H02K 33/00 310/25 |

(Continued)

*Primary Examiner* — Quan Zhen Wang
*Assistant Examiner* — Rajsheed O Black-Childress
(74) *Attorney, Agent, or Firm* — MUNCY, GEISSLER, OLDS & LOWE, P.C.

(57) ABSTRACT

A haptic feedback system is configured to be disposed on a device, and includes: a fixed portion, a movable portion, a driving assembly, and a first connecting assembly. The fixed portion is fixedly connected to the device. The movable portion is movable relative to the fixed portion. The driving assembly is configured to drive the movable portion to move relative to the fixed portion for generating feedback to the device. The movable portion is movably connected to the fixed portion via the first connecting assembly, so that the movable portion has a first vibration mode relative to the fixed portion. The driving assembly receives a first signal having a first frequency, and the first frequency is the same as the frequency of the first vibration mode.

19 Claims, 8 Drawing Sheets

(51) Int. Cl.
  *G03B 5/00* (2021.01)
  *G03B 9/40* (2021.01)
  *G03B 13/36* (2021.01)
  *H02K 11/21* (2016.01)
  *H02K 41/035* (2006.01)
  *H04N 23/51* (2023.01)
  *H04N 23/54* (2023.01)
  *H04N 23/55* (2023.01)
  *H04N 23/57* (2023.01)
  *H05K 1/18* (2006.01)

(56) References Cited

U.S. PATENT DOCUMENTS

| | | | | |
|---|---|---|---|---|
| 2020/0313531 | A1* | 10/2020 | Liu | G06F 3/016 |
| 2020/0412290 | A1* | 12/2020 | Wang | H02K 33/18 |
| 2023/0015265 | A1* | 1/2023 | Shi | H02K 33/00 |

* cited by examiner

HAPTIC FEEDBACK SYSTEM

CROSS REFERENCE TO RELATED APPLICATIONS

This application claims the benefit of U.S. Provisional Application No. 63/230,990 filed Aug. 9, 2021, the entirety of which is incorporated by reference herein.

BACKGROUND OF THE INVENTION

Field of the Invention

The present invention relates to a haptic feedback system, and, in particular, to a haptic feedback system having different vibration modes.

Description of the Related Art

With the advance of technology, the use of electronic devices is becoming more and more common. This is especially true for consumer electronic products, such as mobile phones and smart watches, which have gradually become indispensable parts of modern life. These electronic devices usually have a vibrating function, to notify the user or to enhance the user's experience when using the electronic device. However, the motors used to create vibration in existing devices cannot effectively achieve different vibration modes, and current trends have seen higher and higher requirements on the size of electronic devices, meaning that existing vibration motors have much room for improvement.

BRIEF SUMMARY OF THE INVENTION

An embodiment of the present invention provides a haptic feedback system, which is configured to be disposed on a device and includes: a fixed portion, a movable portion, a driving assembly, and a first connecting assembly. The fixed portion is fixedly connected to the device. The movable portion is movable relative to the fixed portion. The driving assembly is configured to drive the movable portion to move relative to the fixed portion for generating feedback to the device. The movable portion is movably connected to the fixed portion via the first connecting assembly, so that the movable portion has a first vibration mode relative to the fixed portion. The driving assembly receives a first signal having a first frequency, and the first frequency is the same as the frequency of the first vibration mode.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The haptic feedback systems of some embodiments of the present disclosure are described in the following description. However, it should be appreciated that the following detailed description of some embodiments of the disclosure provides various concepts of the present disclosure which may be performed in specific backgrounds that may vary widely. The specific embodiments disclosed are provided merely to clearly describe the usage of the present disclosure by some specific methods without limiting the scope of the present disclosure.

In addition, relative terms such as "lower" or "bottom," "upper" or "top" may be used in the following embodiments in order to describe the relationship between one element and another element in the figures. It should be appreciated that if the device shown in the figures is flipped upside-down, the element located on the "lower" side may become the element located on the "upper" side.

It should be understood that although the terms "first," "second," etc. may be used herein to describe various elements, materials and/or portions, these elements, materials and/or portions are not limited by the above terms. These terms merely serve to distinguish different elements, materials and/or portions. Therefore, a first element, material and/or portion may be referred to as a second element, material and/or portion without departing from the teaching of some embodiments in the present disclosure. Unless defined otherwise, the first or second element, material and/or portion in the claims may be interpreted as any element, material and/or portion in the specification as long as it conforms to the description in the claims.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the terms "substantially," "approximately" or "about" may also be recited in the present disclosure, and these terms are intended to encompass situations or ranges that is substantially or exactly the same as the description herein. It should be noted that unless defined specifically, even if the above terms are not recited in the description, it should be read as the same meaning as those approximate terms are recited.

Figure 1:
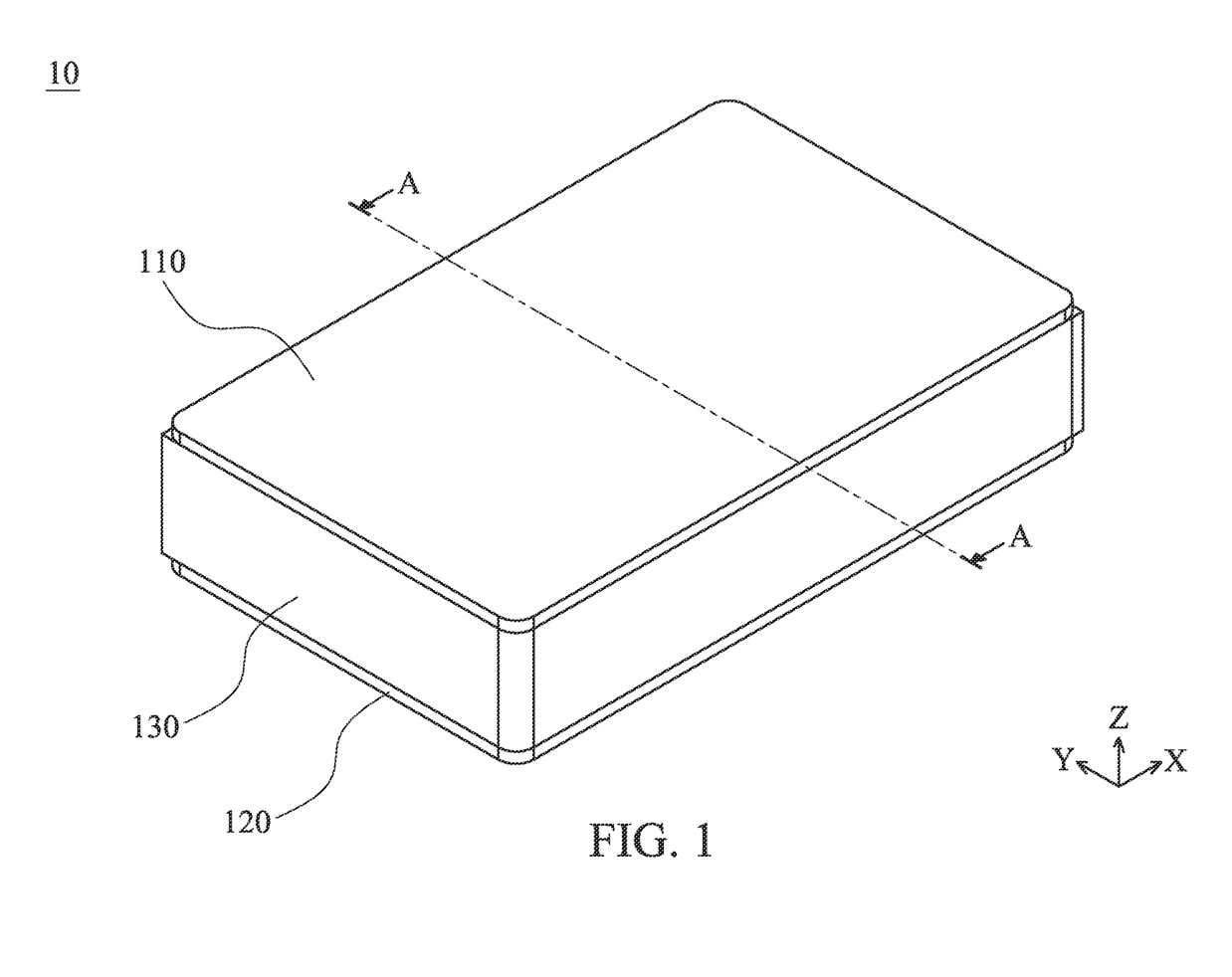
FIG. 1 shows a perspective view of a haptic feedback system in accordance with some embodiments of the present disclosure.

FIG. 1 shows a perspective view of a haptic feedback system 10 in accordance with some embodiments of the present disclosure. It should be noted first that in this embodiment, the haptic feedback system 10 may be, for example, disposed in an electronic device (not shown), and generate a feedback (e.g. haptic feedback) according to different functions. The present disclosure provides a haptic feedback system 10 that is capable of providing different vibration modes and achieving miniaturization. As shown in FIG. 1, the haptic feedback system 10 includes a casing 110, a base 120 and an outer frame 130. In some embodiments, the outer frame 130 is disposed between the casing 110 and the base 120 such that the casing 110, the base 120 and the outer frame 130 may form a substantially rectangular housing.

In some embodiments, the thickness of the outer frame 130 in the vertical direction (e.g. the Z axis) is less than the dimensions of the casing 110 and the base 120 in the horizontal direction (e.g. the direction parallel to the X-Y plane). In this way, the size of the haptic feedback system 10 in at least one direction may be significantly reduced, thereby achieving miniaturization of the electronic device and the haptic feedback system 10 disposed therein. In some embodiments, the casing 110, the base 120 and the outer frame 130 may be different components (for example, the casing 110, the base 120 and the outer frame 130 may be separated from each other), thereby reducing the difficulty of assembling the various components inside the haptic feedback system 10. In other embodiments, the outer frame 130 may be integrated with the casing 110 or the base 120 (e.g. the outer frame 130 may be integrally formed with the casing 110 or the base 120), thereby reducing the assembly steps of the haptic feedback system 10.

Figure 2:
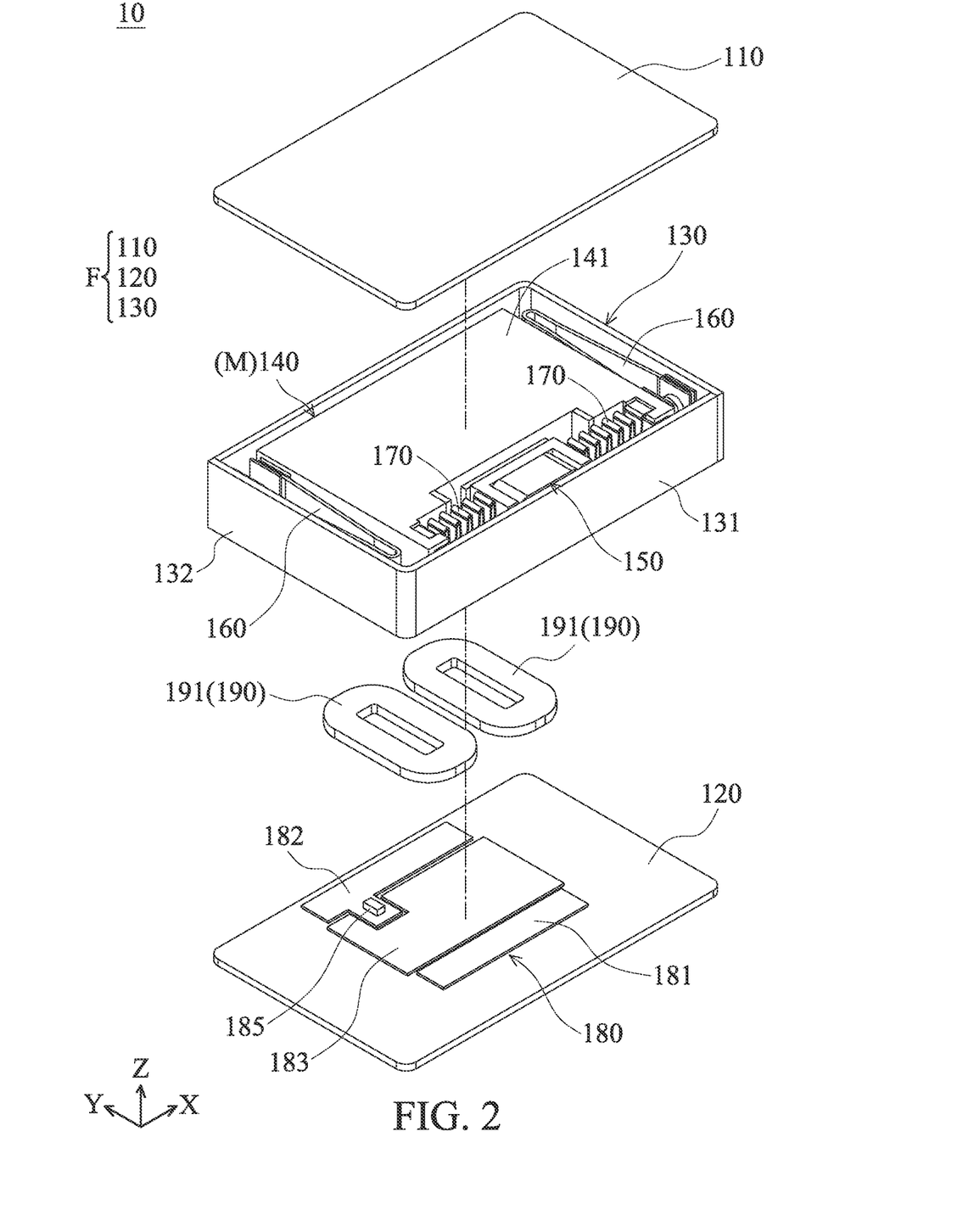
FIG. 2 shows an exploded view of the haptic feedback system in accordance with some embodiments of the present disclosure.

FIG. 2 shows an exploded view of the haptic feedback system 10 in accordance with some embodiments of the present disclosure. As shown in FIG. 2, the haptic feedback system 10 includes a fixed portion F, a movable portion M, a driving assembly 190 and a first connecting assembly 160. In some embodiments, the fixing portion F may include a casing 110, a base 120 and an outer frame 130, and may be fixedly connected to the electronic device where the haptic feedback system 10 is disposed. The movable portion M is movable relative to the fixed portion F. In some embodiments, the movable portion M may include a mode adjustment assembly 140 and may be driven by the driving assembly 190 to move relative to the fixed portion F, so as to generate a feedback (e.g. haptic feedback) to the electronic device. The movable portion M may be movably connected to the fixed portion F via the first connection assembly 160.

In some embodiments, the outer frame 130 may have a first sidewall 131 and a second sidewall 132 connected to each other. The first sidewall 131 and the second sidewall 132 may be substantially perpendicular to each other. In some embodiments, a rounded corner may be formed between the first sidewall 131 and the second sidewall 132, thereby reducing the probability of damage to the outer frame 130 due to collision with other components in the electronic device. In some embodiments, mode adjustment assembly 140 includes a frame 141, an adjustment element 150 and a second connection assembly 170. The frame 141 is connected to the first connection assembly 160. The adjustment element 150 may be movably connected to the frame 141 via the second connecting assembly 170, so that the adjustment element 150 is movable relative to the frame 141 and the fixed portion F. As shown in FIG. In some embodiments, the mass of the adjustment element 150 is different from the mass of the frame 141. The detailed structure of the frame 141 and the operation of the mode adjustment assembly 140 will be further described below with reference to FIG. 3.

In some embodiments, the circuit board 180 is disposed on the base 120, and the circuit board 180 may include a first portion 181 and a second portion 182 that are spaced apart from each other. In other words, the first portion 181 and the second portion 182 are not in direct contact, and a gap is formed between the first portion 181 and the second portion 182. In some embodiments, the shapes of the first portion 181 and the second portion 182 on the base 120 are different, but the present disclosure is not limited thereto. The first portion 181 and the second portion 182 of the circuit board 180 may be physically and electrically connected via the driving assembly 190 (e.g. a coil 191). In this way, signals can be transmitted between the first portion 181 and the second portion 182, thereby reducing the manufacturing cost of the circuit board 180. The circuit board 180 may be used to receive or transmit signals between the driving assembly 190 (e.g. the coil 191) and external components, so that the mode adjustment assembly 140 can generate haptic feedback.

In some embodiments, a metallic sheet 183 may be disposed between the first portion 181 and the second portion 182 to support the drive assembly 190 (e.g. the coil 191) connecting the first portion 181 and the second portion 182. The metallic sheet 183 may be disposed corresponding to the gap between the first portion 181 and the second portion 182. For example, the metallic sheet 183 may be disposed along the contours of the first portion 181 and the second portion 182. For example, the spacing between the metallic sheet 183 and the first portion 181 (and/or the second portion 182) may be kept constant, but the present disclosure is not limited thereto. The metallic sheet 183 may not contact the first portion 181 and the second portion 182 and be electrically insulated from the first portion 181 and the second portion 182. In some embodiments, the metallic sheet 183 may not be electrically connected to any conductive element, and will not be used to transmit any signal. In this way, the probability of forming a short circuit between the metallic sheet 183 and other conductive elements can be reduced. In some embodiments, the metallic sheet 183 may be omitted, or replaced with other insulating materials, and these configurations are within the scope of the present disclosure.

The position sensor 185 may be disposed on the circuit board 180. In some embodiments, the position sensor 185 may be disposed on the second portion 182 and located inside the coil 191 (e.g. surrounded by the coil 191). For example, the position sensor 185 may be a Hall effect sensor, and may be located at a position where the second portion 182 protrudes toward the first portion 181. The position sensor 185 can detect the position of the mode adjustment assembly 140, thereby determining if the parameters related to the transmitted signal and vibration need to be adjusted. However, it should be understood that the above-mentioned configuration is only an example of the present disclosure, and those skilled in the art can derive other similar configurations (for example, setting the position sensor 185 on the first portion 181 or changing the shape or position of the first portion 181 and the second portion 182), and these configurations are all within the scope of the present disclosure.

Figure 3:
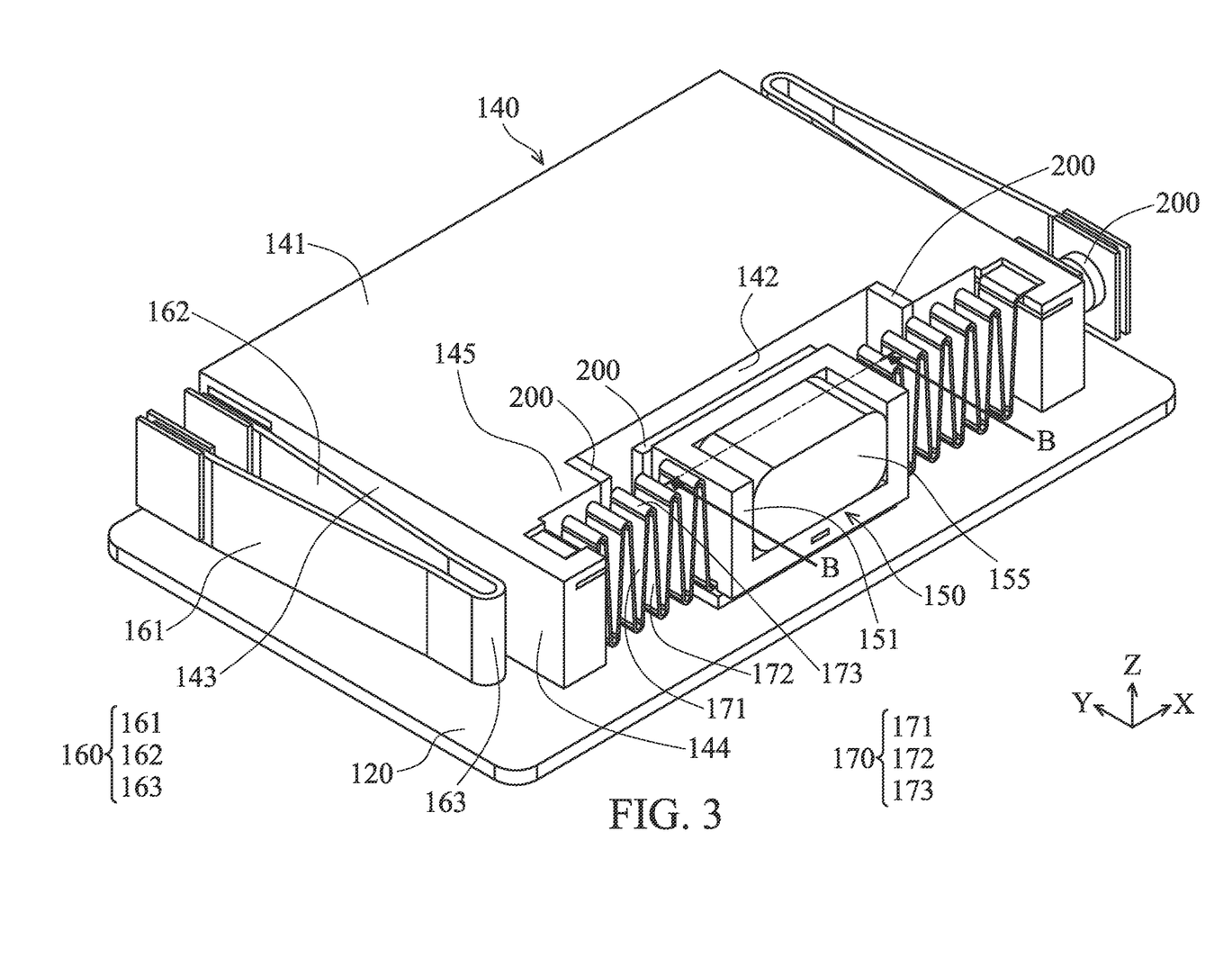
FIG. 3 shows a perspective view of the interior of the haptic feedback system in accordance with some embodiments of the present disclosure.

FIG. 3 shows a perspective view of the interior of the haptic feedback system 10 in accordance with some embodiments of the present disclosure. It should be noted that, in order to clearly illustrate the internal structure of the haptic feedback system 10, the casing 110 and the outer frame 130 will not be shown in this embodiment. As shown in FIG. 3, the frame 141 of the mode adjustment assembly 140 has a first side 142 and a second side 143 that is different from the first side surface 142. In some embodiments, both the first side 142 and the second side 143 are substantially perpendicular to the top surface of the frame 141. The second connecting assembly 170 may connect the outer frame 130 (see FIG. 2) and the second side 143 of the frame 141. Accordingly, the frame 141 is movable relative to the fixing portion F (e.g. the outer frame 130).

The first side 142 may face the adjustment element 150. The frame 141 further has a plurality of protruding portions 144 protruding from the first side 142. The protruding portions 144 may extend to opposite sides of the adjustment element 150. In this way, the second connecting assembly 170 may connect the protruding portion 144 and the adjustment element 150, so that the adjustment element 150 is movable relative to the frame 141. In addition, the frame 141 also has a plurality of stopping portions 145 formed on the first side 142, for example, extending from the first side 142 toward the second connecting assembly 170. The stopping portions 145 can limit the range of motion of the adjustment element 150. In other words, the adjustment element 150 is merely movable within the range between the opposing stopping portions 145. A buffer member 200 may be disposed on the first side 142 and the stopping portions 145. As a result, the adjustment element 150 will contact the buffer member 200 without directly hitting the frame 141 (e.g. the first side 142 and the stopping portions 145). For example, the buffer members 200 may be made of a material (e.g. rubber or colloid) with a hardness that is less than the hardness of the frame 141, and when the adjustment element 150 contacts the buffer member 200, the impact force of the adjustment element 150 may be absorbed, and therefore reducing the probability of damage to the overall mode adjustment assembly 140, or reducing the noise generated by the operation of the adjustment element 150.

The adjustment element 150 may include a carrier 151 and a weighting member 155 disposed in the carrier 151. In some embodiments, the carrier 151 and the weighting member 155 may be made of different materials. For example, the weighting member 155 may be made of high density alloys such as tungsten(W)-containing alloys or any other suitable material, while the carrier 151 may be made of, for example, plastic or any other suitable material. With the arrangement of the weighting member 155, the adjustment element 150 may be arranged with sufficient mass in a limited space, so that the mode adjustment assembly 140 may operate in a desired vibration mode. The carrier 151 is made of a material that is easy to process, so that the desired appearance of the adjustment element 150 may be formed in cooperation with the weighting member 155.

For example, the first connecting assembly 160 may be a spring sheet or other elastic elements. In this embodiment, the first connection assembly 160 includes a first section 161, a second section 162 and a connecting portion 163. For example, the first section 161 and the second section 162 may be defined as a portion extending substantially along a straight line, and the connecting portion 163 may be defined as a portion connecting the first section 161 and the second section 162. In some embodiments, the first segment 161 may be connected to the outer frame 130, the second segment 162 may be connected to the frame 141 (e.g. connected to the second side 143), and the first segment 161 and the second segment 162 are connected via the connecting portion 163. In some embodiments, the extending directions of the first segment 161 and the second segment 162 are not parallel. By disposing the first connecting assembly 160 on opposite sides of the frame 141, the frame 141 is movable in an axial direction (e.g. in a direction substantially parallel to the X-axis). In some embodiments, the orientations of the connecting portions 163 of the first connecting assemblies 160 disposed on opposite sides of the frame 141 are different. More specifically, the connecting portion 163 of one of the first connecting assemblies 160 is disposed to face the protruding portions 144 of the frame 141, and the connecting portion 163 of the other first connecting assembly 160 is disposed to be away from the protruding portions 144 of the frame 141. However, the above configurations are only examples and are not intended to limit the scope of the present disclosure.

For example, the second connecting assembly 170 may be a spring sheet or other elastic elements. In this embodiment, the second connection assembly 170 includes a plurality of first sections 171, a plurality of second sections 172 and a plurality of connecting portions 173. For example, the first sections 171 and the second sections 172 may be defined as portions extending substantially along a straight line, and the connecting portions 173 may be defined as portions connecting the first sections 171 and the second sections 172. In some embodiments, the first sections 171 and the second sections 172 are alternately arranged, and each of the first sections 171 and each of the second sections 172 is connected via a corresponding connecting portion 173. In some embodiments, the connecting portion 163 and the connecting portion 173 are oriented differently. More specifically, the connecting portion 173 may face the casing 110 or the base 120 (see FIG. 2). In some embodiments, the orientation of the connecting portion 163 and the orientation of the connecting portion 173 may be substantially perpendicular, but the present disclosure is not limited thereto. By arranging the second connecting assemblies 170 on opposite sides of the adjustment element 150, the adjustment element 150 is movable in an axial direction (e.g. in a direction substantially parallel to the X-axis). It should be understood that the above configurations are only examples and are not intended to limit the scope of the present disclosure.

Figure 4:
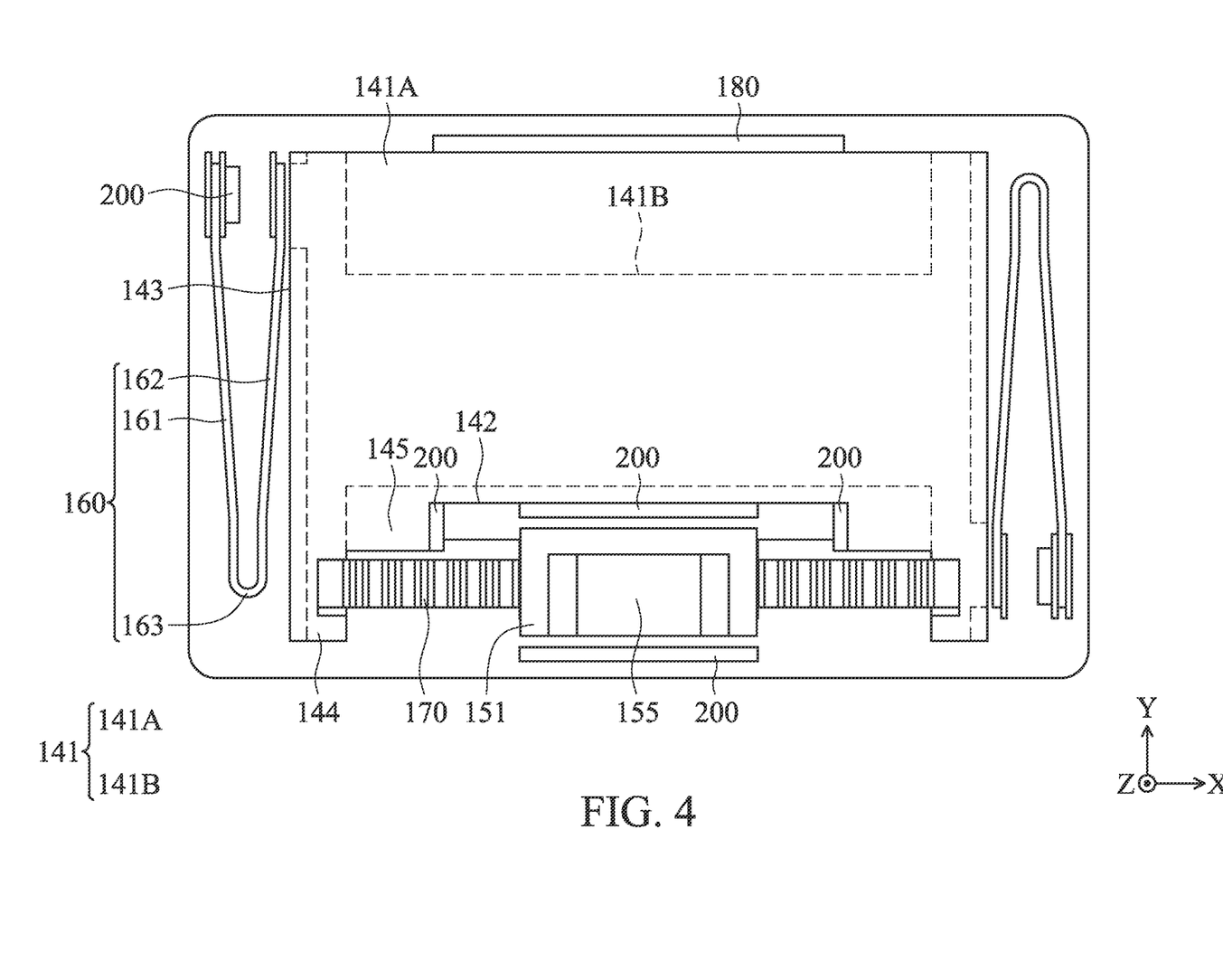
FIG. 4 shows a top view of the interior of the haptic feedback system in accordance with some embodiments of the present disclosure.

FIG. 4 shows a top view of the interior of the haptic feedback system 10 in accordance with some embodiments of the present disclosure. As shown in FIG. 4, the frame 141 may include a body 141A and a metallic member 141B. In some embodiments, the metallic member 141B may be formed in the body 141A by insert molding. In some embodiments, the hardness of the metallic member 141B may be greater than the hardness of the body 141A, thereby improving the overall structural strength of the frame 141. In this embodiment, the metallic member 141B may be exposed on the protruding portion 144 of the frame 141, and the exposed portion of the metallic member 141B may be connected to the second connecting assembly 170 in any suitable manner (e.g. by welding, etc.).

In addition, as shown in FIG. 4, the buffer member 200 may be disposed between the first section 161 and the second section 162 of the first connection assembly 160 to provide the buffer between the first section 161 and the second section 162, reducing the probability of damage to the first connecting assembly 160. In this embodiment, the buffer member 200 may be disposed on the first section 161, but the present disclosure is not limited thereto. In other embodiments, the buffer member 200 may also be disposed on the second section 162 (between the first section 161 and the second section 162), or on the connecting portion 163 (located between the connecting portion 163 and the frame 141). These embodiments are intended to be included within the scope of the present disclosure. With the configuration of the buffer element 200, the service life of the first connection assembly 160 and/or the mode adjustment assembly 140 may be prolonged, or the noise generated by the mode adjustment assembly 140 during operation may be reduced.

The circuit board 180 may generate a signal or receive a signal from the outside, and transmit the signal to the driving assembly 190 (the coil 191), and therefore the coil 191 and the magnetic element of the driving assembly 190 can generate a driving force to drive the movable portion M to move relative to the fixed portion F. Since the driving force has a specific frequency, the mode adjustment assembly 140 of the movable portion M is caused to resonate, so that the mode adjustment assembly 140 vibrates, forming a vibration mode. In this way, the haptic feedback system 10 can achieve the function of generating haptic feedback. In some embodiments, the circuit board 180 may extend beyond the projection range of the frame 141 on the X-Y plane. For example, the circuit board 180 may be closer to the outer frame 130 (see FIG. 2) than the frame 141, but the present disclosure is not limited thereto.

For example, the coil 191 may receive a first signal, wherein the first signal has a first frequency, and causes the movable portion M to have a first vibration mode relative to the fixed portion F. In this embodiment, the first frequency is the same as the frequency of the first vibration mode. More specifically, when the movable portion M moves in the first vibration mode, the movable portion M (e.g. the frame 141) is movable (e.g. in a linear motion) relative to the fixed portion F in a first dimension (e.g. along a direction substantially parallel to the X-axis). Meanwhile, the adjustment element 150 is movable relative to the frame 141 in a first movement manner, and the frequency of the first movement manner is substantially the same as the frequency of the first vibration mode. When the adjustment element 150 moves relative to the frame 141 in the first movement manner, the adjustment element 150 is movable (for example, linear motion) in a second dimension (for example, in a direction substantially parallel to the X-axis). When the movable portion M moves in the first vibration mode, a first phase difference exists between the movement of the frame 141 relative to the fixed portion F and the movement of the adjustment element 150 relative to the frame 141. For example, the frame 141 and the adjustment element 150 may reach the extreme position in the direction of the positive X-axis (that is, the farthest position relative to the center of the haptic feedback system 10 that is reachable in this direction). The phase difference between the movement of the frame 141 and the movement of the adjustment element 150 may be approximately 0 degrees.

The movable portion M may have a second vibration mode relative to the fixed portion F by setting the mode adjustment assembly 140, wherein the frequency of the first vibration mode and the frequency of the second vibration mode are different. For example, the coil 191 may receive a second signal, wherein the second signal has a second frequency, and causes the movable portion M to have a second vibration mode relative to the fixed portion F. In this embodiment, the second frequency is the same as the frequency of the second vibration mode. When the movable portion M moves in the second vibration mode, the movable portion M moves relative to the fixed portion F in the first dimension (e.g. along a direction substantially parallel to the X-axis). At this time, the adjustment element 150 moves relative to the frame 141 in a second movement manner, and the frequency of the second movement manner is the same as the frequency of the second vibration mode. When the adjustment element 150 moves relative to the frame 141 in the second movement manner, the adjustment element 150 moves in the second dimension (e.g. in a direction substantially parallel to the X-axis). When the movable portion M moves relative to the frame 141 in the second vibration mode, a second phase difference exists between the movement of the frame 141 relative to the fixed portion F and the movement of the adjustment element 150 relative to the frame 141, and the first phase difference and the second phase difference are different. For example, when the frame 141 reaches the extreme position in the direction of the positive X-axis, the adjustment element 150 may reach the extreme position in the direction of the negative X-axis, and the phase difference between the movement of the frame 141 and the movement of the adjustment element 150 may be about 90 degrees. In some embodiments, the difference between the first phase difference and the second phase difference is greater than 45 degrees, but the present disclosure is not limited thereto.

As set forth above, since the movement of the frame 141 and the adjustment element 150 may have different phase differences, the movable portion M of the haptic feedback system 10 can generate different vibration modes, thereby achieving the effect of generating different types of haptic feedback. It should be understood that, although the above embodiments illustrate two vibration modes, those skilled in the art should be able to derive other or more vibration modes according to the content of the present disclosure. The vibration modes that are achievable by the disclosed structures are all within the scope of the present disclosure.

Figure 5:
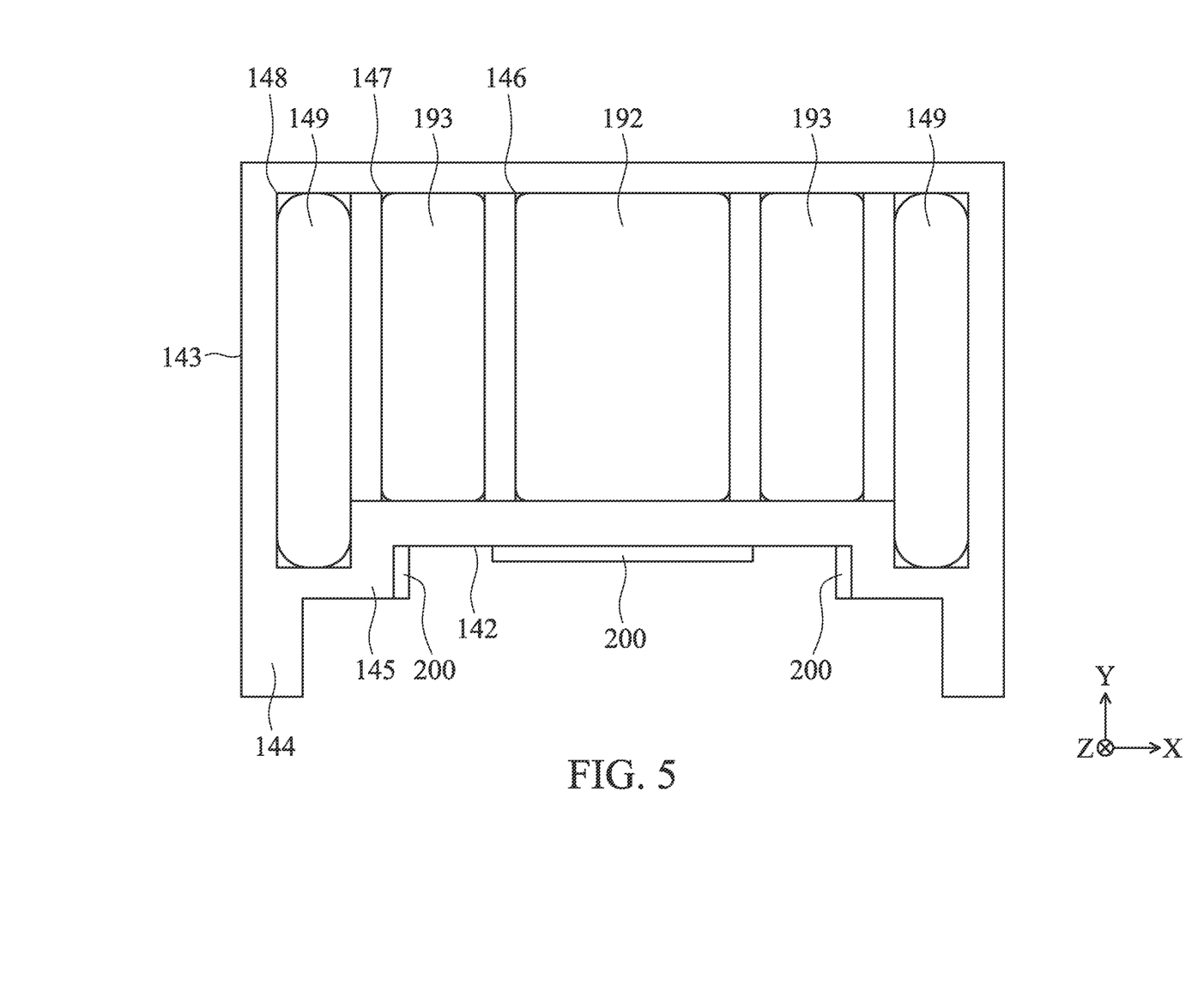
FIG. 5 shows a bottom view of a frame of a mode adjustment assembly in accordance with some embodiments of the present disclosure.

FIG. 5 shows a bottom view of the frame 141 of the mode adjustment assembly 140 in accordance with some embodiments of the present disclosure. As shown in FIG. 5, the frame 141 has a plurality of grooves 146, 147 and 148 for containing different components. In some embodiments, the driving assembly 190 may include a first magnetic element 192 and a pair of second magnetic elements 193, which may generate a driving force with the coil 191 to drive the mode adjustment assembly 140. In some embodiments, the magnetic pole directions of the first magnetic element 192 and the second magnetic elements 193 may be different. For example, the magnetic pole direction of the first magnetic element 192 may be directed toward the negative Y-axis direction, and the magnetic pole direction of the second magnetic elements 193 may be directed toward the positive Y-axis direction, but the present disclosure is not limited thereto. For the brevity of the description, other magnetic pole configurations of the first magnetic element 192 and the second magnetic elements 193 will not be listed separately, but all possible magnetic pole configurations are included within the scope of the present disclosure.

In this embodiment, the first magnetic element 192 is contained in the groove 146, and the second magnetic elements 193 are each accommodated in one of the grooves 147. It should be noted that, in some embodiments, the first magnetic element 192, the second magnetic elements 193, and the corresponding grooves 146 and 147 are not completely fitted, that is, there may be gaps between the first magnetic element 192 and the groove 146 (e.g. in the corners of the groove 146), and there may be gaps between the second magnetic elements 193 and the grooves 147 (e.g. in the corners of the grooves 147). In this way, the assembly difficulty of the first magnetic element 192 and the second magnetic elements 193 may be reduced.

The mode adjustment assembly 140 further includes weighting members 149. In some embodiments, frame 141

(e.g. body 141A) and the weighting members 149 may be made of different materials. For example, the weighting members 149 may be made of high density alloys such as tungsten(W)-containing alloys or any other suitable material, while the body 141A of the frame 141 may be made of, for example, plastic or any other suitable material. With the arrangement of the weighting members 149, the mode adjustment assembly 140 may be arranged with sufficient mass in a limited space, so that the mode adjustment assembly 140 can operate in a required vibration mode. The body 141A is made of an easy-to-process material, so that the desired shape of the mode adjustment assembly 140 can be obtained by combining the body 141A with the weighting members 149. In this embodiment, the weighting members 149 are each contained in one of the grooves 148. Similarly, the weighting members 149 and the corresponding grooves 148 are not fully fitted, i.e. there may be gaps between the weighting members 149 and the grooves 148 (e.g. in the corners of the grooves 148). In this way, the assembly difficulty of the weighting members 149 can be reduced.

Figure 6:
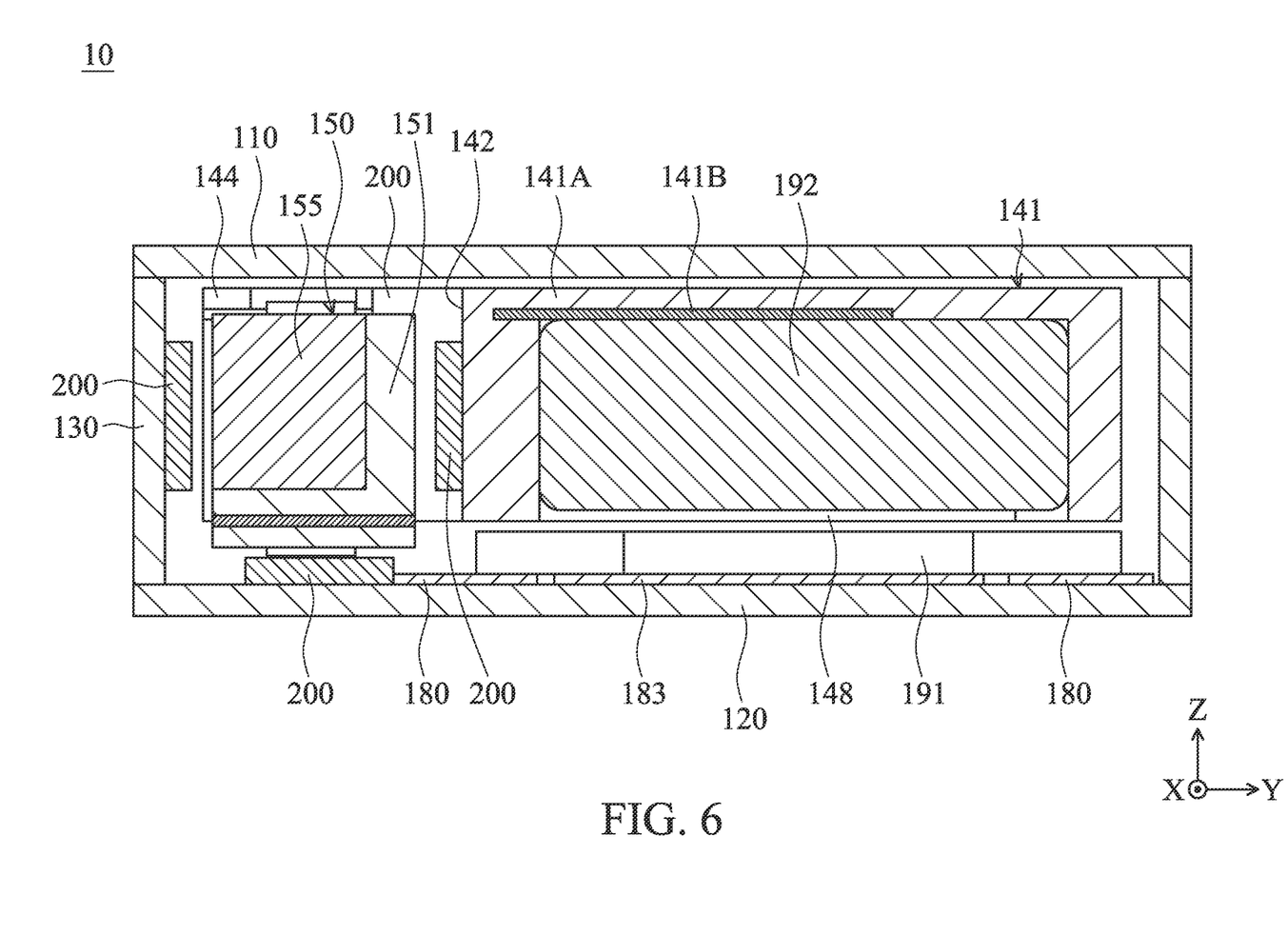
FIG. 6 shows a cross-sectional view of the haptic feedback system along line A-A shown in FIG. 1 in accordance with some embodiments of the present disclosure.

FIG. 6 shows a cross-sectional view of the haptic feedback system 10 along line A-A shown in FIG. 1 in accordance with some embodiments of the present disclosure. As shown in FIG. 6, multiple buffer members 200 are provided around the adjustment element 150. For example, the buffer members 200 may be disposed on the surfaces of the outer frame 130, the base 120 and the frame 141, wherein these surfaces face the adjustment element 150. In some embodiments, the buffer members 200 may also be disposed on the surface of the casing 110 facing the adjustment element 150, so as to further reduce the probability of the adjustment element 150 colliding with surrounding elements. In some embodiments, the thickness of the buffer member 200 disposed on the base 120 may be greater than the thickness of the circuit board 180, and the thicknesses of the buffer member 200 and the circuit board 180 may be measured along a direction that is substantially parallel to the Z-axis, for example. In this way, the probability of the circuit board 180 being struck by the adjustment element 150 can be reduced.

In some embodiments, the metallic member 141B of the frame 141 may partially overlap the first magnetic element 192 in a direction that is substantially parallel to the Z-axis. For example, the shortest distance between the metallic member 141B and the first side 142 may be smaller than the shortest distance between the first magnetic element 192 and the first side 142. These shortest distances may be measured along a direction that is parallel to the Y-axis, for example, but the present disclosure is not limited thereto. In some embodiments, the metallic member 141B may completely overlap the first magnetic element 192 in a direction that is substantially parallel to the Z-axis. In addition, as shown in FIG. 6, the weighting member 149 may be disposed lower than the first magnetic element 192, and therefore the weighting member 149 may be closer to the coil 191 than the first magnetic element 192.

Figure 7:
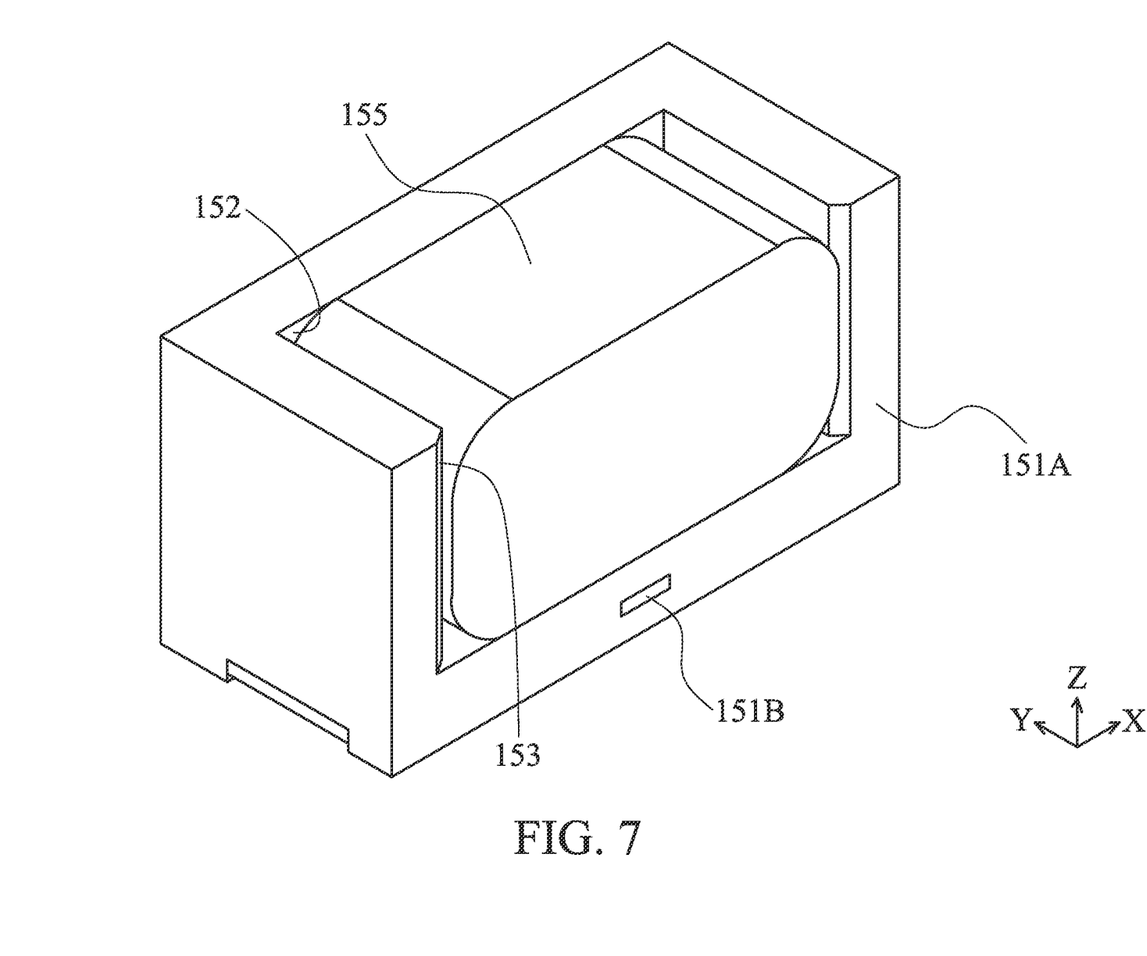
FIG. 7 shows a perspective view of an adjustment element in accordance with some embodiments of the present disclosure.

FIG. 7 shows a perspective view of the adjustment element 150 in accordance with some embodiments of the present disclosure. As shown in FIG. 7, the carrier 151 of the adjustment element 150 includes a body 151A and a metallic member 151B embedded in the body 151A. The metallic member 151B may be formed in the body 151A by insert molding. In some embodiments, the hardness of the metallic member 151B may be greater than the hardness of the body 151A, thereby improving the overall structural strength of the carrier 151. The carrier 151 has a recess 152 configured to contain the weighting member 155. Similarly, the weighting member 155 and the corresponding recess 152 are not fully fitted, that is, there may be gaps between the weighting member 155 and the recess 152 (e.g., in the corners of the recess 152). In some embodiments, the recess 152 may be disposed to face the outer frame 130, that is, the recess 152 cannot be seen when viewed from the first surface 142 of the frame 141 to the adjustment element 150. In some embodiments, a bevel structure 153 may be disposed on the outer edges of the recess 152, and the above configuration can reduce the difficulty of disposing the weighting member 155, but the present disclosure is not limited thereto. In other embodiments, the bevel structure 153 may be omitted, thereby reducing the difficulty of manufacturing the carrier 151.

Figure 8:
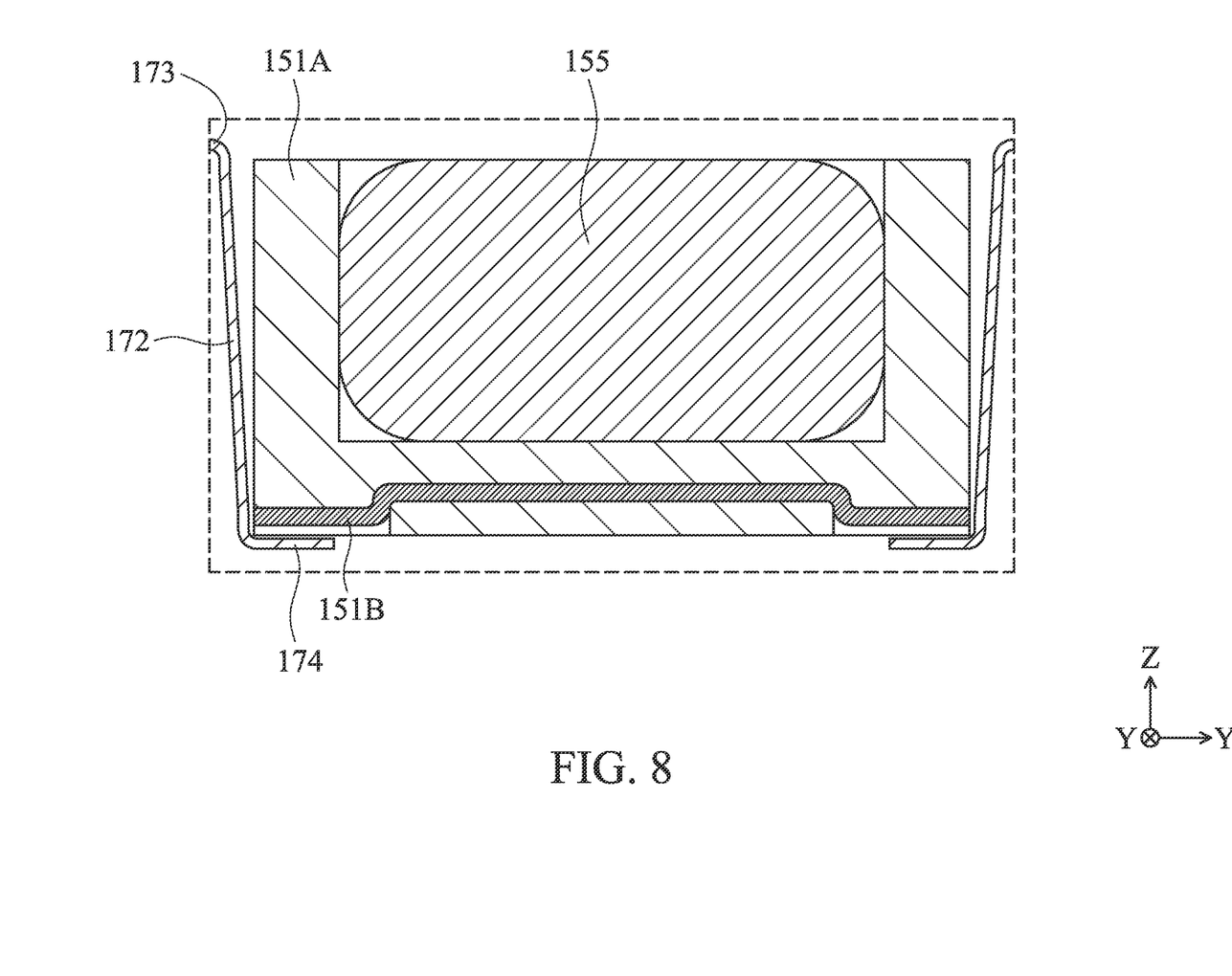
FIG. 8 shows a cross-sectional view of the adjustment element along line B-B shown in FIG. 3 in accordance with some embodiments of the present disclosure.

FIG. 8 shows a cross-sectional view of the adjustment element 150 along line B-B shown in FIG. 3 in accordance with some embodiments of the present disclosure. As shown in FIG. 8, the second connecting assembly 170 further includes an extension portion 174 connected to the second section 172. In this embodiment, the metallic member 151B may be partially exposed from the body 151A, and the exposed portion of the metallic member 151B may be connected to the extension portion 174 of the second connecting assembly 170 in any suitable manner (e.g. by welding, etc.). In addition, in this cross-sectional view, the metallic member 151B may have a non-linear profile within the carrier 151. More specifically, the metallic member 151B may be located higher (compared to the exposed portion of the metallic member 151B) at a position corresponding to the weighting member 155 and wrapped by the body 151A. In some embodiments, a portion of the metallic member 151B corresponding to the weighting member 155 and another portion of the metallic member 151B not corresponding to the weighting member 155 are located on different planes. In this way, the structural strength of the carrier 151 may be improved to bear the weight of the weighting member 155.

In summary, the present disclosure provides a haptic feedback system with different vibration modes. The movable portion and the fixed portion may have vibration modes with different frequencies by setting the mode adjustment assembly. Because the driving assembly receives signals of different frequencies, different phase differences may exist between the movements of the frame and the adjustment element of the mode adjustment assembly, thereby achieving different vibration modes. In addition, a plurality of buffer members are arranged around the movable range of the movable portion, thereby prolonging the service life of the haptic feedback system or reducing the noise generated when the haptic feedback system operates.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A haptic feedback system, configured to be disposed on a device, and comprising:
   a fixed portion fixedly connected to the device;
   a movable portion movable relative to the fixed portion;
   a driving assembly configured to drive the movable portion to move relative to the fixed portion for generating feedback to the device; and
   a first connecting assembly, wherein the movable portion is movably connected to the fixed portion via the first connecting assembly, so that the movable portion has a first vibration mode relative to the fixed portion,
   wherein the driving assembly receives a first signal having a first frequency, and the first frequency is the same as a frequency of the first vibration mode,
   wherein the movable portion further comprises a mode adjustment assembly for making the movable portion enter a second vibration mode relative to the fixed portion, the frequency of the first vibration mode is different from a frequency of the second vibration mode, and the mode adjustment assembly comprises:
   a frame connecting the first connecting assembly;
   an adjustment element movable relative to the frame, wherein the adjustment element is movable relative to the fixed portion; and
   a second connecting assembly, wherein the adjustment element is movably connected to the frame via the second connecting assembly,
   wherein mass of the adjustment element is different from mass of the frame.

2. The haptic feedback system as claimed in claim 1, wherein the frame has:
   a first side facing the adjustment element;
   a second side, different from the first side, wherein the first connecting assembly is movably connected to the second side;
   a plurality of opposite protruding portions protruding from the first side and extending to opposite sides of the adjustment element, wherein the second connecting component movably connects the protruding portions and the adjustment element; and
   a plurality of stopping portions formed on the first side and extending toward the second connecting assembly.

3. The haptic feedback system as claimed in claim 2, wherein a buffer member is disposed on a plurality of surfaces of the first side and the stopping portions respectively, wherein the surfaces face the adjustment element, and when the adjustment element is located in an extreme position, the adjustment element contacts one of the buffer members.

4. The haptic feedback system as claimed in claim 1, wherein the adjustment element comprises:
   a carrier, having:
   a body having a recess, wherein the recess is disposed to face the fixed portion; and
   a metallic member embedded in the body, wherein the metallic member is partially exposed from the body and connected to the second connection assembly, and a hardness of the metallic member is greater than a hardness of the body; and
   a weighting member disposed in the recess, wherein the carrier and the weighting member are made of different materials, and a portion of the metallic member that corresponds to the weighting member and another portion of the metallic member that does not correspond to the weighting member are located on different planes.

5. The haptic feedback system as claimed in claim 1, wherein the second connecting assembly comprises a plurality of first sections, a plurality of second sections, and a plurality of connecting portions, the first sections and the second sections are alternately disposed, and each of the first sections is connected to the adjacent second section by one of the connecting portions.

6. The haptic feedback system as claimed in claim 5, wherein the first connecting assembly comprises a first section, a second section, and a connecting portion, the connecting portion of the first connecting assembly connects the first section of the first connecting assembly and the second section of the first connecting assembly, the first section of the first connecting assembly is connected to the fixed portion, and the second section of the first connecting assembly is connected to the frame, wherein an orientation of the connecting portion of the first connecting assembly is different from an orientation of the connecting portion of the second connecting assembly.

7. The haptic feedback system as claimed in claim 1, wherein the frame has a weighting member and a plurality of grooves, the weighting member is disposed in one of the grooves, the driving assembly is disposed in another of the grooves, a gap is formed between the weighting member and the one of the grooves, and the gap is located in a corner of the one of the grooves.

8. The haptic feedback system as claimed in claim 1, wherein:
   when the movable portion moves in the first vibration mode, the movable portion moves relative to the fixed portion in a first dimension; and
   when the movable portion moves in the second vibration mode, the movable portion moves relative to the fixed portion in the first dimension.

9. The haptic feedback system as claimed in claim 1, wherein:
   when the movable portion moves in the first vibration mode, the adjustment element moves relative to the frame in a first movement manner, and a frequency of the first movement manner is the same as the frequency of the first vibration mode;
   when the adjustment element moves relative to the frame in the first movement manner, the adjustment element moves in a second dimension; and
   when the movable portion moves in the first vibration mode, a first phase difference exists between the movement of the frame relative to the fixed portion and the movement of the adjustment element relative to the frame.

10. The haptic feedback system as claimed in claim 9, wherein:
    when the movable portion moves in the second vibration mode, the adjustment element moves relative to the frame in a second movement manner, and a frequency of the second movement manner is the same as the frequency of the second vibration mode;
    when the adjustment element moves relative to the frame in the second movement manner, the adjustment element moves in the second dimension; and
    when the movable portion moves in the second vibration mode, a second phase difference exists between the movement of the frame relative to the fixed portion and the movement of the adjustment element relative to the frame.

11. The haptic feedback system as claimed in claim 10, wherein:
the first phase difference is different from the second phase difference;
the difference between the first phase difference and the second phase difference is greater than 45 degrees;
the first dimension is a linear movement in a first axis; and
the second dimension is a linear movement in the first axis.

12. The haptic feedback system as claimed in claim 1, wherein the first connecting assembly comprises a first section, a second section, and a connecting portion, the connecting portion connects the first section and the second section, the first section is connected to the fixed portion, and the second section is connected to the movable portion, wherein an extending direction of the first section is not parallel to an extending direction of the second section.

13. The haptic feedback system as claimed in claim 12, wherein a buffer member is disposed between the first section and the second section or between the connecting portion and the movable portion.

14. The haptic feedback system as claimed in claim 1, wherein the driving assembly comprises:
a coil disposed on the fixed portion;
a first magnetic element disposed on the movable portion; and
a second magnetic element disposed on the movable portion, wherein a magnetic pole direction of the first magnetic element is different from a magnetic pole direction of the second magnetic element.

15. The haptic feedback system as claimed in claim 1, wherein the fixed portion further comprises:
a casing;
a base, wherein the casing is disposed over the base; and
an outer frame disposed between the housing and the base, wherein the outer frame has a first sidewall and a second sidewall connected to each other, the first sidewall is substantially perpendicular to the second sidewall, and a rounded corner is formed between the first sidewall and the second sidewall.

16. The haptic feedback system as claimed in claim 15, wherein a buffer member is disposed on a surface of the casing or on a surface of the base or on a surface of the outer frame, and the surfaces of the casing, the base and the outer frame face the movable portion.

17. A haptic feedback system, configured to be disposed on a device, and comprising:
a fixed portion fixedly connected to the device;
a movable portion movable relative to the fixed portion;
a driving assembly configured to drive the movable portion to move relative to the fixed portion for generating feedback to the device;
a first connecting assembly, wherein the movable portion is movably connected to the fixed portion via the first connecting assembly, so that the movable portion has a first vibration mode relative to the fixed portion, wherein the driving assembly receives a first signal having a first frequency, and the first frequency is the same as a frequency of the first vibration mode; and
a circuit board and a position-sensing element, wherein the circuit board comprises:
a first portion disposed on the fixed portion; and
a second portion disposed on the fixed portion and spaced apart from the first portion, wherein the driving assembly connects the first portion and the second portion, the position-sensing element is disposed on the first portion or on the second portion, and located in the driving assembly.

18. The haptic feedback system as claimed in claim 17, further comprising a metallic sheet disposed between the first portion and the second portion, wherein:
the metallic sheet is separated from the first portion and the second portion;
a spacing between the metallic sheet and the first portion or between the metallic sheet and the second portion is constant;
the metallic sheet is electrically insulated from the first portion and the second portion; and
the driving assembly is disposed on the metallic sheet.

19. The haptic feedback system as claimed in claim 17, wherein a buffer member is disposed on the fixed portion, and a thickness of the buffer member on the fixed portion is greater than a thickness of the circuit board.

* * * * *